United States Patent
Sutardja et al.

(10) Patent No.: US 8,583,991 B1
(45) Date of Patent: Nov. 12, 2013

(54) HIGH DENSITY MULTI-LEVEL MEMORY

(75) Inventors: Pantas Sutardja, Los Gatos, CA (US); Zining Wu, Los Altos, CA (US); Toai Doan, Santa Clara, CA (US); Aditya Ramamoorthy, Ames, IA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/542,353

(22) Filed: Jul. 5, 2012

Related U.S. Application Data (63) Continuation of application No. 11/614,868, filed on Dec. 21, 2006, now Pat. No. 8,219,886.

(60) Provisional application No. 60/760,575, filed on Jan. 20, 2006.

(51) Int. Cl.
*G06F 11/00* (2006.01)

(52) U.S. Cl.
USPC ............... 714/769; 714/781; 365/185.03

(58) Field of Classification Search
None
See application file for complete search history.

(56) References Cited

U.S. PATENT DOCUMENTS

| | | | |
|---|---|---|---|
| 5,224,106 A | 6/1993 | Weng | |
| 7,197,690 B2 | 3/2007 | Shen et al. | |
| 7,373,581 B2 | 5/2008 | Okamura et al. | |
| 7,421,041 B2 | 9/2008 | Khandekar et al. | |
| 7,971,130 B2 | 6/2011 | Ramamoorthy | |
| 2005/0149843 A1 | 7/2005 | Shen et al. | |
| 2006/0008255 A1 | 1/2006 | Yen et al. | |
| 2007/0162818 A1 | 7/2007 | Shen et al. | |
| 2007/0245214 A1 | 10/2007 | Ramamoorthy | |
| 2010/0002112 A1 | 1/2010 | Tay | |
| 2011/0016370 A1 | 1/2011 | Chen | |
| 2011/0258509 A1 | 10/2011 | Ramamoorthy | |

FOREIGN PATENT DOCUMENTS

| | | |
|---|---|---|
| WO | WO 02/086719 A2 | 10/2002 |
| WO | WO2005/036401 A2 | 4/2005 |

OTHER PUBLICATIONS

Ungerboeck, "Channel Coding with Multilevel/Phase Signals," IEEE Transactions on Information Theory, vol. IT-28, No. 1, Jan. 1982, pp. 55-67.

*Primary Examiner* — Christopher McCarthy (57) ABSTRACT

Embodiments of the present invention provide high density, multi-level memory. Thus, various embodiments of the present invention provide a memory apparatus in accordance with various embodiments of the present invention includes a memory block comprising a plurality of cells, each cell adapted to operate with multi-level signal. Such a memory apparatus also includes a channel block adapted to code data values in accordance with a coding scheme that favorably effects a distribution of the multi-levels of the multi-level signals, and to output the corresponding multi-level signals of the coded data values to the memory block. Other embodiments may be described and claimed.

23 Claims, 7 Drawing Sheets

HIGH DENSITY MULTI-LEVEL MEMORY

CROSS REFERENCE TO RELATED APPLICATIONS

This application is a continuation of, and claims priority to, co-pending, commonly-owned to U.S. patent application Ser. No. 11/614,868, filed Dec. 21, 2006, entitled "High Density Multi-Level Memory," and U.S. Provisional Patent Application No. 60/760,575, filed Jan. 20, 2006, entitled "High Density Multi-Level Flash Memory Architecture," the entire disclosure of which is hereby incorporated by reference in its entirety.

TECHNICAL FIELD

Embodiments of the present invention relate to the field of integrated circuits, and more particularly, to high density multi-level memory.

BACKGROUND

In order to increase memory capacity, manufacturers have continually moved memory chip or on-chip memory (such as flash memory) production to smaller process geometries over the last few years. Recently, multi-level signal memory cells have been used to increase flash memory capacity. In such an arrangement, a cell is configured to produce distinct signal threshold levels, which results in distinct read-back levels. With four level signals available per cell, two bits may be included into each flash memory cell. One problem with writing with four signal levels into each cell is that the distinction between adjacent levels may become difficult to discern. This is often referred to in the art as reduced signal distance (often shown as reduced $D_{min}$).

When writing a signal level to a given cell, there is generally an amount of uncertainty in the written-in signal level. When the probable distribution of each signal level overlaps the probable distribution of adjacent signal level, the signal level generally may not be determined by using a simple prior art slicer circuit. This results in a limit on the number of many signal levels that may be employed to write into every cell.

Because of various problems, the number of target signal levels may not be defined too largely in the prior art for current signal level threshold detection methods to reliably read and write the data. While it may be possible to increase the number of signal levels beyond the current signal level limit of four, this is generally not expected, by those skilled in the art, to provide a significant improvement in memory density. For example, two more levels to a four-level cell do not even add one more bit to the storage capacity. It will take four more levels, a total of eight signal levels, to enable a cell to store three bits.

SUMMARY OF THE INVENTION

In accordance with various embodiments of the present invention, a memory apparatus includes a memory block comprising a plurality of cells, with each cell adapted to operate with multi-level signals. The memory apparatus also includes a channel block adapted to code data values in accordance with a coding scheme that favorably effects a distribution of the multi-levels of the multi-level signals, and to output the multi-level signals of the coded data values to the memory block.

In accordance with various embodiments, the memory apparatus further includes a controller operatively coupled to the channel block and operatively coupled to the memory block, wherein the controller is adapted to control the coding by the channel block, and wherein the controller is adapted to control the receiving of the multi-level signals by the memory block.

In accordance with other embodiments, the channel block is adapted to code the multi-level signals data values to be written into the memory block with a high gain coding, and the controller is further adapted to control writing the coded data values into the memory block using multi-level signals.

In accordance with further embodiments, the high gain coding comprises one of pulse amplitude modulation code, quadrature amplitude modulation code, low density parity check code, trellis coded modulation, coset code, Reed-Solomon code, binary Bose, Ray-Chaudhuri, Hocquenghem (BCH) code, or non-binary BCH code.

In accordance with various embodiments, the memory block includes at least one reference cell, wherein the channel block is adapted to receive multi-level signals from the memory block and to decode the received multi-level signals, and wherein the channel block is further adapted to compensate the received multi-level signals based upon a reference multi-signal output from one or more of the at least one reference cell.

In accordance with other embodiments, the channel block is further adapted to receive multiple multi-level signals output from the memory block, buffer the multiple multi-level signals, analyze the multiple multi-level signals as a whole and compensate the multiple multi-level signals as a whole based upon the at least one reference cell.

In accordance with further embodiments, the memory block includes multiple reference cells and the channel block is adapted to compensate multi-level signals output from the memory block based on a reference multi-level signal from one or more of the multiple reference cells.

In accordance with various embodiments, the channel block is adapted to receive multi-level signals from the memory block and to decode the received multi-level signals, and wherein the channel block is further adapted to use information within the received multi-level signals to compensate the received multi-level signals.

In accordance with various embodiments, the controller is further adapted to interface with an external system.

In accordance with other embodiments, the memory block is included on an integrated circuit chip that does not include the channel block and the controller.

In accordance with further embodiments, the channel block and the controller are included together on one integrated circuit.

In accordance with various embodiments, the memory block is configured as a flash memory device.

In accordance with various embodiments, the memory block comprises one of a floating gate device, oxide-nitride-oxide (ONO) charge trapping device or a phase change memory device.

In accordance with other embodiments, the memory block is a stand-alone integrated circuit.

In accordance with various embodiments, the channel block and the controller are included together on one integrated circuit.

In accordance with further embodiments, the memory apparatus further includes an error correction code (ECC) block adapted to encode data values from the controller with an ECC and forward the ECC encoded data values to the channel block, the ECC block further adapted to correct data values from the channel block based upon the ECC and forward them to the controller.

In accordance with other embodiments, the ECC is based on Reed-Solomon code.

In accordance with various embodiments, the memory apparatus further includes a digital bus interface operatively coupled to the channel block and memory block, and the channel block is adapted to output multi-level signals to the memory block serially via the digital bus interface.

In accordance with various embodiments, the channel block is adapted to receive multi-level signals from the memory block serially.

In accordance with other embodiments, the received multi-level signals are in the form of discrete time analog signals.

In accordance with various embodiments, the channel block includes an analog-to-digital converter (ADC) and the ADC is adapted to digitize the received multi-level signals.

In accordance with further embodiments, the memory block includes an analog-to-digital converter that is adapted to digitize multi-level signals.

In accordance with various embodiments, the channel block is adapted to receive multiple multi-level signals from the memory block and to decode the received multi-level signals, buffer the multiple multi-level signals, analyze the multiple multi-level signals as a whole and compensate the multiple multi-level signals based on the buffered signals.

In accordance with various embodiments of the present invention, a method includes receiving a multi-level signal corresponding to a coded data value, from a cell within a memory block, the memory block including a plurality of cells and the coded data value having been coded in accordance with a high gain coding to favorably effect a distribution of the multi-levels of the multi-level signal. The method also includes decoding the coded data value with respect to the high gain coding.

In accordance with various embodiments of the present invention, a method includes coding a data value with a high gain coding and writing the coded data value into a memory block using a multi-level signal. The high gain coding is used to effect a distribution of the multi-levels of the multi-level signal.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the present invention, the phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments of the present invention provide high density, multi-level memory.

Figure 1:
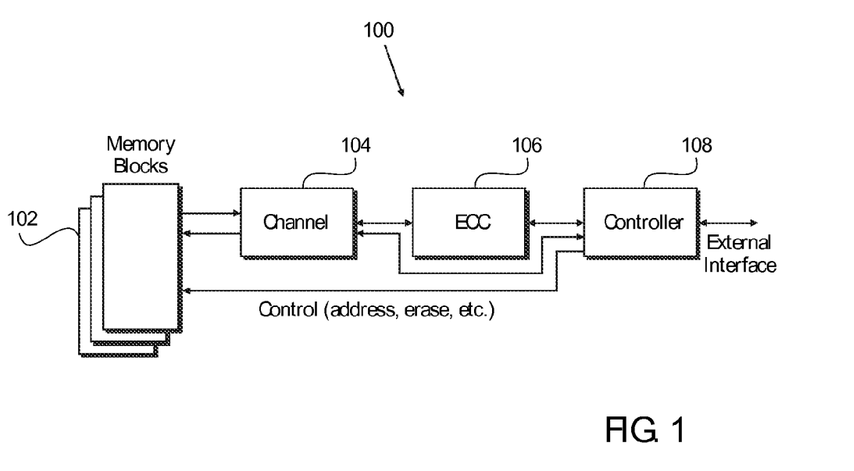
FIG. 1 schematically illustrates a memory arrangement in accordance with various embodiments of the present invention.

In general, a block diagram of a memory arrangement 100, in accordance with various embodiments of the present invention, is illustrated in FIG. 1. Memory arrangement 100 includes one or more memory blocks 102 that each includes memory cell arrays, as well as read and write circuits. Memory arrangement 100 also includes a channel block 104 that performs signal processing used to decode signal levels received from memory blocks 102. In accordance with various embodiments, channel block 104 also performs signal processing to code various data values to write into memory block 102. In accordance with various embodiments of the present invention, an error correction code (ECC) block 106 for correcting residual error after data detection by channel block 104 may be included, if desired. ECC block 106 also, in accordance with various embodiments, encodes the data values with ECC prior to writing the data (with ECC bits) to memory blocks 102, using various signal levels. In accordance with various embodiments, channel block 104 and ECC block 106 may be a single block. A controller 108 is provided to interface to external system(s) to receive and send data signals through its external data interface, to and from the channel block 104 or ECC block 106. Controller 108 performs various tasks including tasks that direct where data values need to be written into or read from the memory blocks 102 depending upon command instructions received through its external interface. In various embodiments, memory blocks 102 may be flash memory blocks.

In accordance with various embodiments of the present invention, a high gain coding such as, for example, trellis coded modulation (TCM) is used by channel block 104 to code and/or decode multi-level signal data values to and/or from a memory block 102. The addition of TCM imposes a certain constraint as to what sample sets may be adjacent to a previous and a future sample sequence. Various codes may be used to allow multi-level signal data values with a spread distribution that reduces overlaps with one another, enabling the multi-level signal data values to be more likely detected correctly, using e.g. maximum likelihood detection with trellis control. Quadrature amplitude modulation code (QAM) and low density parity check (LDPC) codes are other examples of codes that may be used. LDPC codes belong to a class of linear block codes that include Reed-Solomon codes, binary and non-binary Bose, Ray-Chaudhuri, Hocquenghem (BCH) codes, Coset codes, etc., all of which are suitable for use in various embodiments of the present invention. By encoding the multi-level signal data values with high gain coding, a higher reliability of reading and writing the multi-level signals may be achieved within each memory cell, which in turn may lead to increase in data density of a memory array (reduce usage of memory cells for ECC and other auxiliary information).

ECC block 106, in accordance with various embodiments, encodes and decodes multi-level signal data values with ECC. An example of ECC includes Reed-Solomon code (RS-ECC).

Thus, as an example, in accordance with various embodiments of the present invention, in a write mode, multi-level signals that are employed to write various data into memory cells within memory blocks 102 are ECC encoded to add redundant symbols. The ECC encoded data pass through channel block 104 for channel encoding with the high gain coding. The ECC and high gain encoded data signals are output to memory blocks 102 to write data into the memory cells.

During a read mode, in accordance with various embodiments of the present invention, memory blocks 102 responsive to the commands of controller 108 output data stored in at least one memory cell. In accordance with various embodiments, data stored in a whole row of memory cells may be output at different read-back signal levels. The multi-level read-back signals for each cell are transferred to channel block 104. If a small interface is desired, the signals may be transferred in a serial fashion. In one embodiment, analog to digital conversion or a digitizing function (not shown), may be performed by an analog to digital converter (ADC) that is included on memory block 102 if inclusion of such an ADC is practical. Thus, the signal levels may be transferred as digitized data and sent back to channel block 104 serially. Otherwise, in accordance with various embodiments, analog signals may be transferred back to channel block 104 from memory block 102 as discrete time analog signals. Such transfers, in accordance with various embodiments, may be done serially if desired, or in parallel, in other embodiments. In a serial embodiment, channel block 104 may either digitize the signal or not based upon whether an analog or digital channel implementation is used. In accordance with various embodiments of the present invention, a digital channel implementation may be used and thus, channel block 104 includes an ADC, and memory block 102 and channel block 104 are operatively coupled to one another via a digital bus interface.

Figure 2:
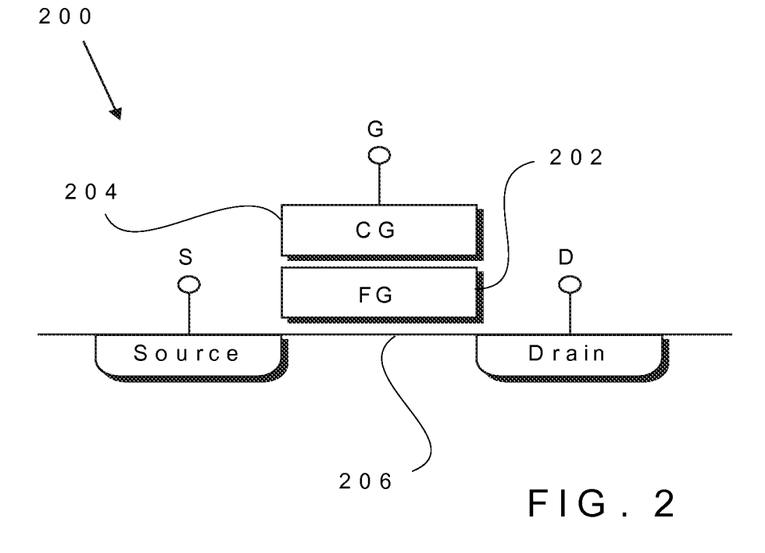
FIG. 2 schematically illustrates an exemplary transistor for a flash memory cell suitable for use to practice various embodiments of the present invention.
Figure 3:
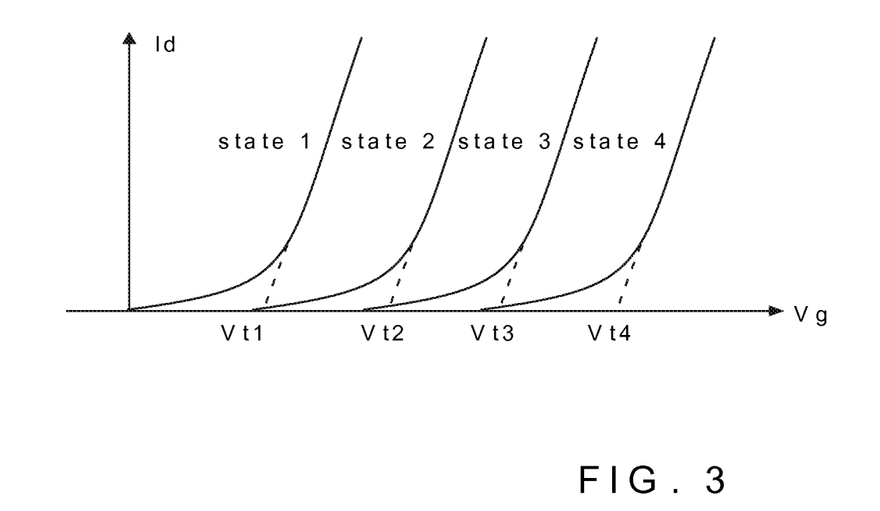
FIG. 3 is a graph illustrating transistor characteristics corresponding to different charge levels.
Figure 4:
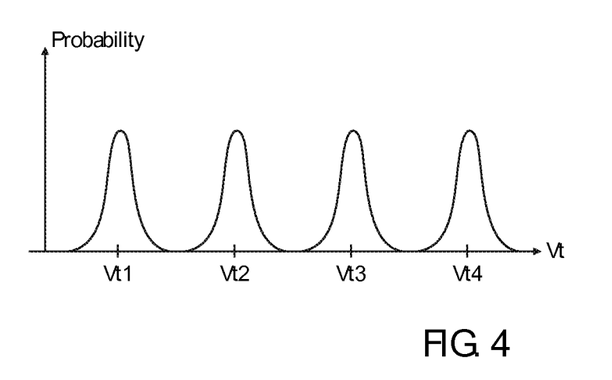
FIG. 4 is a graph illustrating a probability density distribution for the threshold voltage of a system of four charge level flash memory cells.

Generally, an exemplary flash memory cell, in accordance with various embodiments of the present invention and depicted in FIG. 2, includes an insulated gate transistor 200 that includes a floating gate 202 between the channel 206 and the control gate 204. Charge trapped in floating gate 202 modifies the turn-on threshold voltage. The transistor characteristics are illustrated in FIG. 3, corresponding to different charge levels stored on floating gate 202. With devices that include a plurality of memory cells arranged in arrays, many parameters that naturally vary from one device to another due to imperfect process control may affect the programmed threshold of the device. Consequently, if one were to write to many devices targeting a certain threshold value, the end result is a distribution of target threshold values instead of the desired distinct target threshold values. FIG. 4 illustrates a typical probability density function (PDF) for the target threshold voltages of a system of flash memory cells, each cell having four target charge levels.

Figure 5:
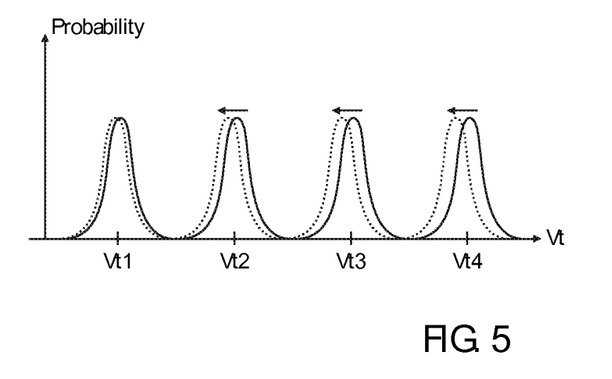
FIG. 5 is a graph illustrating the shift profile for the probability distribution for the threshold voltage of a system of four charge level flash memory cells.
Figure 6:
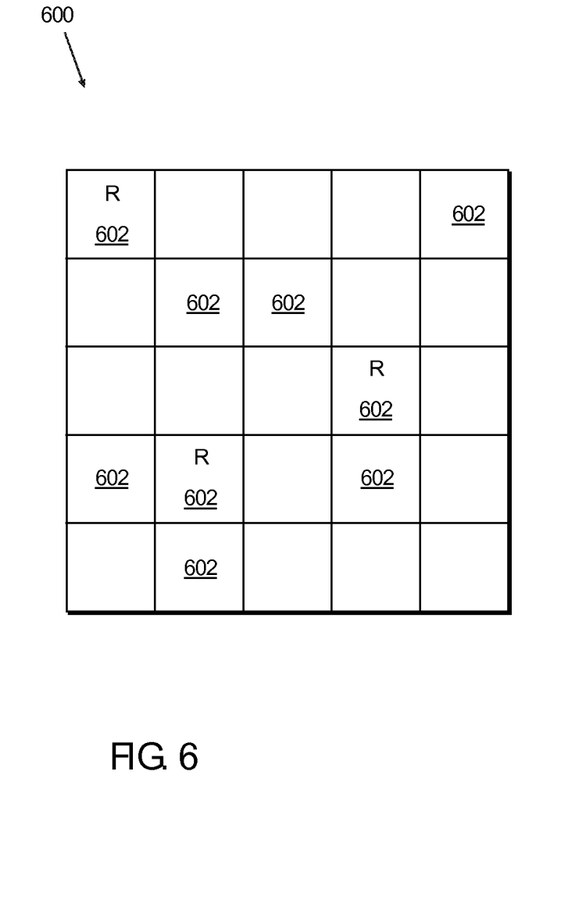
FIG. 6 schematically illustrates a memory cell array in accordance with various embodiments of the present invention.

Over time, the charge trapped in floating gate 202 generally leaks slowly and the threshold voltage may shift back towards a lower value. While the leakage is generally slow, the specification for any commercially acceptable storage device typically requires the data to be readable even after a ten-year period. The rate of leakage of the floating gate charge is dependent upon the voltage on floating gate 202. FIG. 5 illustrates a typical shift profile for the threshold PDF over time. Furthermore, the physics of charge leakage in a memory cell is such that each signal level may leak at a different rate from the others. As such, over time, the signal levels generally will not drop at the same rate. Thus, in accordance with various embodiments of the present invention, reference signal thresholds are written into reference cells with some or all of the possible signal levels within the memory block. Such reference cells may effectively provide a future reference for accurately detecting the stored data. As noted, the reference signal thresholds may be written into specially allocated cells that serve as reference cells. FIG. 6 schematically illustrates a memory cell array 600 that includes a plurality of memory cells 602. One or more cells may be allocated as reference cells R, in accordance with various embodiments of the present invention.

Channel block 104 may analyze the reference signals output from the reference cells and determine how much the reference signals have degraded due to, for example, leakage. Channel block 104 may then use this determination to compensate the signals representing data that are output from memory blocks 102 to provide a more accurate reading of the data signals. Examples of compensation include, but are not limited to, gain offset and direct current (DC) offset.

In accordance with the various embodiments of the present invention, data signals output from memory blocks 102 are decoded as a sequence using channel block 104. This may allow for normalization of changes in the signal levels due to leakage over time, based upon the reference signals. This may also allow for reliable detection of overlapping signal levels, especially due to the high gain coding, by matching a channel block's trellis control to the written-in trellis coding.

In accordance with various embodiments, if the high gain coding assures that most of the possible target signal levels accurately write each data sequence, there may not be a need for separate reference cells. In such embodiments, channel block 104 may include a non-linear detector that automatically adapts data signals to the standard deviation of the target signal levels and the mean values for those levels.

Figure 7:
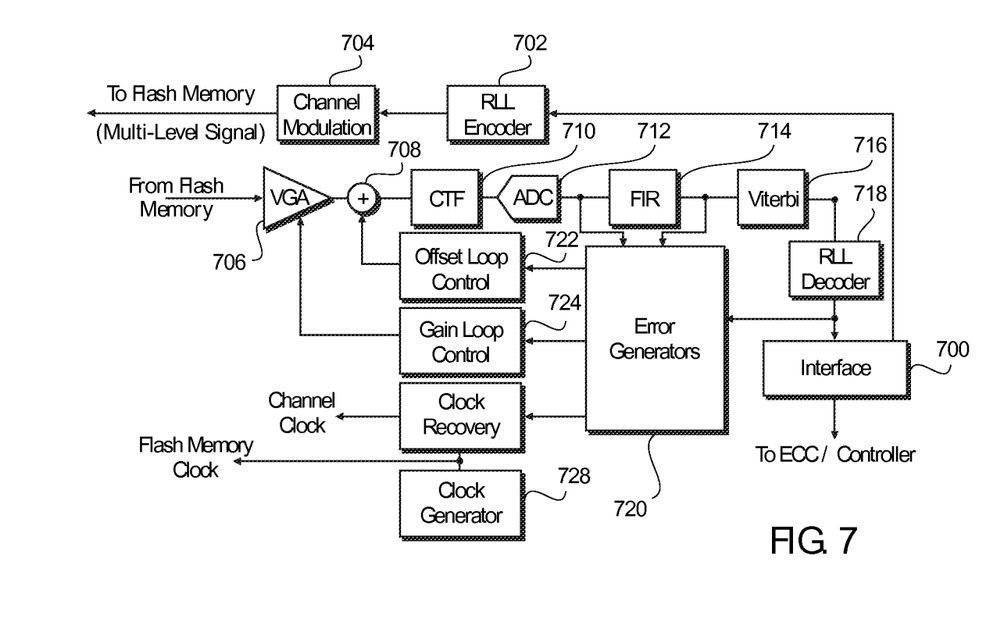
FIGS. 7 and 8 schematically illustrate exemplary channel block implementations in accordance with various embodiments of the present invention.

In accordance with various embodiments, an exemplary channel block 104 may be configured similar to generally known communication or magnetic hard disk drive (HDD)

channels, as illustrated in FIG. 7. As may be seen in FIG. 7, such an exemplary channel block may include an interface 700, a run length limited (RLL) encoder 702 and channel modulation 704 along a write path. The exemplary channel block 104 may further include a variable gain amplifier (VGA) 706, an offset setting 708, a continuous time filter (CTF) block 710, an ADC 712, a finite impulse response (FIR) block 714, a Viterbi detector 716, an RLL decoder 718, error generators 720, an offset control loop 722, a gain control loop 724, a clock recovery 726 and clock generator 728 along a read path, coupled to each other substantially as illustrated.

Some simplification may be made from a conventional channel block. For example, since data sampling and transfer, in accordance with various embodiments, are clocked synchronously, there is no need to include a timing recovery circuit (726, 728) in channel block 104. Such a timing recovery circuit may be included if desired such as, for example, for very high data-rate applications. However, generally the sampling clock frequency matches exactly to the incoming data signal frequency and thus, only the delay is potentially unknown. For such a system only a Type I timing recovery loop may be desired.

Additionally, the signal returning from memory blocks 102 may match well to the target response, i.e., the original signal, such that linear equalizers in the channel block (CTF 710 and FIR 714) may not be necessary. Other functional blocks typical of a communication/HDD channel may be included, in accordance with various embodiments of the present invention, for memory arrangement 100. In particular, as noted above, automatic gain control loop 724, Viterbi detector 716 (with trellis control) and channel encoder/decoder (702, 718) may also be included.

Often, standard deviation in the distribution of each target signal level is different from the others, and the mean distance between two adjacent ideal signal levels may not be constant relative to the design target. Thus, in accordance with various embodiments, the Viterbi detector may implement adaptive and non-linear branch metrics calculators (e.g., the Viterbi detector may use a non-linear detector algorithm used in magnetic HDD).

Figure 8:
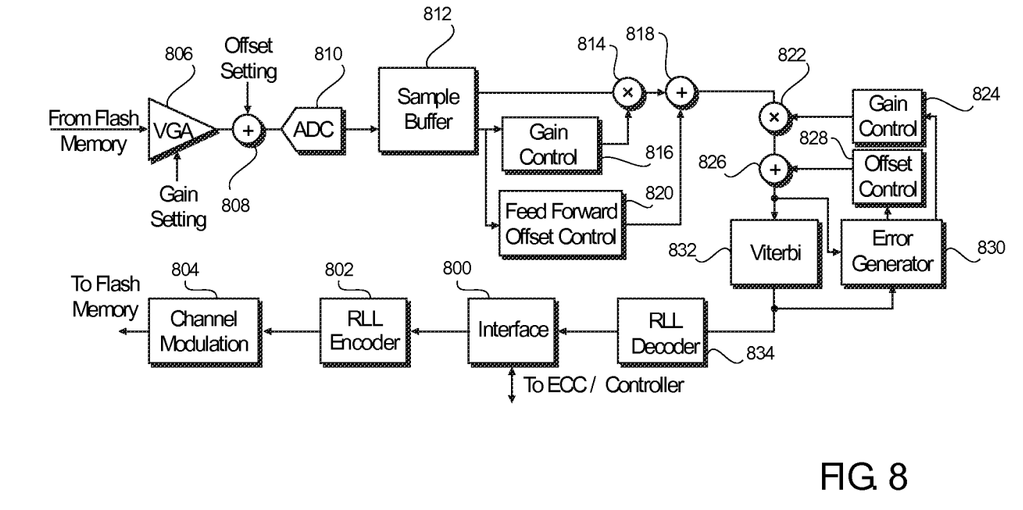

In accordance with various embodiments of the present invention, channel block 104 may also include a sample data buffer capable of storing a large section of data samples so iterative or over-a-block processing may be performed (e.g., block averaging for gain control so that signal levels may become normalized before other processing by the channel block). An example of such an arrangement for channel block 104 is schematically illustrated in FIG. 8. As may be seen, such an exemplary channel block 104 may include an interface 800, RLL encoder 802 and channel modulation 804 along a write path. The exemplary channel block may further include a VGA 806, offset setting 808, ADC 810, sample buffer 812, gain setting 814, gain control 816, offset setting 818, feed forward offset control 820, gain setting 822, gain control 824, offset setting 826, offset control 828, error generator 830, Viterbi 832 and RLL decoder 834, coupled to each other substantially as illustrated.

Figure 9:
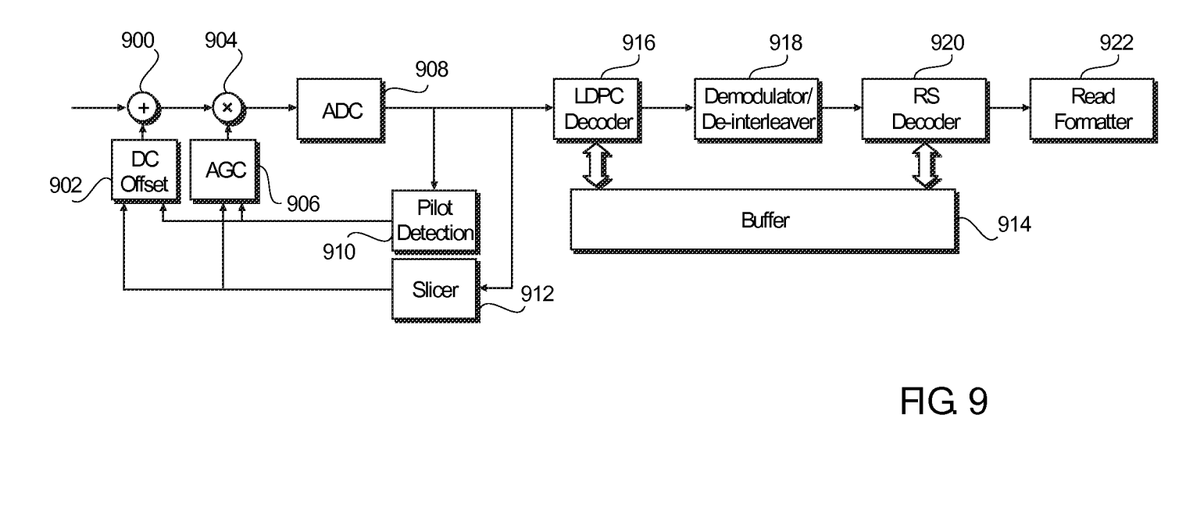
FIG. 9 schematically illustrates an example of a read path of an exemplary channel block for an LDPC coded memory arrangement in accordance with various embodiments of the present invention.

FIG. 9 schematically illustrates an example of a read path of an exemplary channel block 104 for an LDPC coded memory arrangement in accordance with various embodiments of the present invention. As may be seen, such an exemplary channel may include offsetting 900, DC offset 902, gain setting 904, automatic gain control (AGC) 906, ADC 908, pilot detection 910, slicer 912, buffer 914, LDPC decoder 916, demodulator/de-interleaver 918, RS (ECC) decoder 920 and read formatter 922, coupled to each other substantially as illustrated.

For current state of the art integrated circuit (IC) processes, it may be desirable to avoid putting complex circuits on a memory chip since memory processes generally tend to be optimized in such a way as to be less suitable for high speed mixed-mode signal processing functions that the channel block typically desires. Hence, one implementation of the present invention is to include the memory block on a chip separate from the chip that includes the channel block and/or the controller. The channel block and the controller, as well as an ECC block, may be included on a single chip or separate chips as desired. However, to reduce the chip count, a channel block, an ECC block and a controller may be included on the same chip.

By placing the memory blocks on a chip that is stand-alone, in accordance with various embodiments of the present invention, the selection of high gain coding for the channel coding scheme may be tied to the channel block. The memory blocks only need to write exactly as instructed by the channel block or the controller. As newer and better modulation coding or other signal processing becomes available, only the channel block may need to be redesigned without the need to redesign the memory blocks. Thus, an interface from the channel block to the memory blocks may include a digital sample value data interface.

Another manner in which to reduce circuit complexity of the memory blocks, in accordance with various embodiments, is to adapt the channel block such that it performs binary data to a multi-level sample value conversion and sends the sample values to the memory blocks for writing of the sample values.

In accordance with various embodiments of the present invention, at least the memory blocks, and even the entire memory arrangement, is a flash-type memory device. For clarity, the present invention has been substantially described as such, although those skilled in the art will understand that other types of memory may benefit from the present invention. Additionally, in accordance with various embodiments of the present invention, the present invention is useful for many types of memory devices such as, for example and not limited to, floating gate devices, oxide-nitride-oxide (ONO) charged trapping devices, and phase change memory devices.

While the present invention is useful for all types of devices that use memory, it is especially useful for portable electronic devices, such as, for example, mobile phones, laptop computers, personal digital assistants, gaming devices, music players, and video players. In various embodiments, the portable electronic devices may include reduced instruction set (RISC) processors and wireless communication support, such as wireless communication in accordance with one or more of the Institute of Electrical and Electronic Engineer's (IEEE) 802.11 family of standards.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A memory apparatus comprising:
   a memory block comprising a plurality of cells, wherein each cell of the plurality of cells is configured to operate at a plurality of target charge levels; and
   a channel block configured to
   (i) code data values in accordance with a coding scheme that affects a distribution of a plurality of multi level signals,
   (ii) output the coded data value of each of the plurality of multi-level signals to one of the plurality of cells of the memory block at one of the plurality of target charge levels,
   (iii) receive one or more of the coded data values of the plurality of multi level signals from the memory block, and
   (iv) decode the one or more coded data values of the plurality of multi-level signals received from the memory block based at least in part on the plurality of target charge levels.

2. The memory apparatus of claim 1, further comprising a controller that is operatively coupled to the channel block and the memory block,
   wherein the controller is configured to
   (i) interface to one or more external systems to send and receive data signals,
   (ii) control the coding or decoding of the channel block, and
   (iii) allocate (a) which cell of the plurality of cells of the memory block a corresponding coded data value is output to by the channel block, or (b) which cell of the plurality of cells of the memory block a corresponding coded data value is received from by the channel block.

3. The memory apparatus of claim 2, wherein the memory block is a component of an integrated circuit chip that does not include the channel block or the controller.

4. The memory apparatus of claim 2, wherein the channel block and the controller are components of the same integrated circuit.

5. The memory apparatus of claim 2, wherein the channel block is further configured to code data values associated with the plurality of multi level signals to be output to the plurality of cells of the memory block using high gain coding, and
   wherein the controller is further configured to control outputting the coded data values to the plurality of cells of the memory block by the channel block.

6. The memory apparatus of claim 5, wherein the high gain coding of the channel block comprises one of pulse amplitude modulation code, quadrature amplitude modulation code, low density parity check code, trellis coded modulation, coset code, Reed Solomon code, binary Bose, Ray-Chaudhuri, Hocquenghem (BCH) code, and non binary BCH code.

7. The memory apparatus of claim 5, further comprising an error correction code (ECC) block,
   wherein the ECC block is configured to
   (i) encode data values received from the controller with an ECC and forward the ECC encoded data values to the channel block, and
   (ii) correct data values received from the channel block based upon the ECC and forward the corrected data values to the controller.

8. The memory apparatus of claim 7, wherein the ECC is based on Reed-Solomon code.

9. The memory apparatus of claim 1, wherein the channel block is further configured to
   (i) receive a plurality of coded data values of the plurality of multi-level signals from the memory block,
   (ii) buffer the received plurality of coded data values,
   (iii) analyze the received the plurality of coded data values collectively, and
   (iv) modify the received plurality of coded data values in response to determining a loss of charge in at least one reference cell of the plurality of cells of the memory block.

10. The memory apparatus of claim 1, wherein the memory block further comprises a plurality of reference cells, and wherein the channel block is further configured to modify the received plurality of coded data values of the plurality of multi-level signals in response to receiving a reference signal from one or more of the plurality of reference cells of the memory block.

11. The memory apparatus of claim 10, wherein the channel block is further configured to
    (i) receive a reference signal from each of the plurality of reference cells of the memory block, wherein each received reference signal corresponds to one of the plurality of target charge levels,
    and
    (ii) modify the received plurality of coded data values of the plurality of multi-level signals in response to determining a loss of charge in at least one reference cell of the plurality of reference cells of the memory block.

12. The memory apparatus of claim 1, wherein each cell of the plurality of cells of the memory block comprises at least one of a floating gate device, an oxide nitride-oxide (ONO) charge trapping device, and a phase change memory device.

13. The memory apparatus of claim 1, wherein each cell of the plurality of cells of the memory block is configured to operate at only one of four target charge levels at a time.

14. The memory apparatus of claim 1, wherein the channel block includes a non-linear detector that automatically adapts the data values to (i) a standard deviation of the target charge levels and (ii) the mean values of the target charge levels.

15. The memory apparatus of claim 1, wherein the channel block includes a Viterbi detector to implement adaptive and non-linear branch metrics calculators.

16. The memory apparatus of claim 1, wherein the channel block includes a sample data buffer capable of storing a section of data samples, and the channel block is further configured to normalize the multi level signals based, at least in part, on the section of data samples.

17. A method comprising:
    receiving, at a channel block a plurality of multi-level signals;
    coding, by the channel block, data values corresponding to the received plurality of multi-level signals, in accordance with a high gain coding scheme that affects a distribution of the plurality of multi-level signals in accordance with a plurality of target signal levels; and
    outputting, by the channel block, each of the coded data values corresponding to the received plurality of multi-level signals at one of the target signal levels.

18. The method of claim 17, further comprising:
    receiving, at the channel block, a coded data value associated with one of the plurality of multi level signals; and
    decoding, by the channel block, the received coded data value associated with the one of the plurality of multi level signals in accordance with the high gain coding scheme, to obtain a data value corresponding to one of the target signal levels.

19. The method of claim 18, further comprising:
receiving, at the channel block, a reference signal corresponding to one of the target signal levels; and
modifying the decoded data value associated with the one of the plurality of multi level signals based upon the signal output by the received reference signal.

20. The method of claim 18, wherein the received coded data value associated with one of the plurality of multi level signals is coded in accordance with a high gain coding scheme including one of pulse amplitude modulation code, quadrature amplitude modulation code, low density parity check code, trellis coded modulation, coset code, Reed-Solomon code, binary Bose, Ray-Chaudhuri, Hocquenghem (BCH) code, and non-binary BCH code.

21. The method of claim 18, further comprising correcting, by the channel block, the decoded data value associated with the one of the plurality of multi level signals using an error correction code (ECC).

22. The method of claim 21, wherein the ECC includes Reed-Solomon code.

23. The method of claim 18, further comprising modifying, by the channel block, the decoded data value associated with the one of the plurality of multi level signals based upon information within the multi-level signal.

\* \* \* \* \*